(12) United States Patent
Lehmann et al.

(10) Patent No.: US 7,684,277 B2
(45) Date of Patent: Mar. 23, 2010

(54) NON-VOLATILE MEMORY DEVICE WITH CONTROLLED APPLICATION OF SUPPLY VOLTAGE

(75) Inventors: Gunther Lehmann, Holzkirchen (DE); Michael Diel, Dachau (DE); Mario Di Ronza, Munich (DE)

(73) Assignee: Infineon Technologies AG, Munich (DE)

( * ) Notice: Subject to any disclaimer, the term of this patent is extended or adjusted under 35 U.S.C. 154(b) by 465 days.

(21) Appl. No.: 11/613,949

(22) Filed: Dec. 20, 2006

(65) Prior Publication Data

US 2007/0165466 A1 Jul. 19, 2007

(30) Foreign Application Priority Data

Dec. 22, 2005 (DE) .................. 10 2005 061 719

(51) Int. Cl.
*G11C 5/14* (2006.01)
(52) U.S. Cl. .............. 365/227; 365/185.25; 365/189.05; 365/189.11; 365/200; 365/226
(58) Field of Classification Search ............ 365/185.08, 365/185.09, 185.25, 94, 103, 189.01, 189.05, 365/189.11, 200, 226, 227
See application file for complete search history.

(56) References Cited

U.S. PATENT DOCUMENTS

| 5,502,674 | A |   | 3/1996  | Griffus et al. |
|-----------|---|---|---------|----------------|
| 5,565,791 | A |   | 10/1996 | Raza           |
| 5,671,186 | A | * | 9/1997  | Igura .......................... 365/203 |
| 5,835,410 | A | * | 11/1998 | Yach et al. ............. 365/185.21 |
| 6,038,194 | A | * | 3/2000  | Davies .................. 365/230.06 |
| 6,509,598 | B2 |  | 1/2003  | Okuda          |
| 6,536,003 | B1 |  | 3/2003  | Gaziello et al. |
| 6,826,068 | B1 | * | 11/2004 | Shiga et al. ................... 365/63 |
| 6,967,879 | B2 |  | 11/2005 | Mizukoshi      |

FOREIGN PATENT DOCUMENTS

| JP | 62177798  | 8/1987  |
|----|-----------|---------|
| JP | 07073693  | 3/1995  |
| JP | 2001210092| 8/2001  |
| JP | 2001273781| 10/2001 |
| JP | 2004185795| 7/2004  |

OTHER PUBLICATIONS

English Translation of Japan Patent Office Action dated Jun. 23, 2009.

* cited by examiner

*Primary Examiner*—VanThu Nguyen
(74) *Attorney, Agent, or Firm*—Patterson & Sheridan, L.L.P.

(57) ABSTRACT

Embodiments of the invention provide a memory device comprising a non-volatile memory element, a read-out circuit for reading out an item of memory information stored in the memory element, a switching unit, by means of which a supply voltage can be applied to the read-out circuit, and a control unit, which has the capability of controlling the switching unit in a manner dependent on the memory information stored in the memory element.

27 Claims, 5 Drawing Sheets

NON-VOLATILE MEMORY DEVICE WITH CONTROLLED APPLICATION OF SUPPLY VOLTAGE

CROSS-REFERENCE TO RELATED APPLICATIONS

This application claims foreign priority benefits under 35 U.S.C. §119 to co-pending German patent application number DE 10 2005 061 719.0, filed 22 Dec. 2005. This related patent application is herein incorporated by reference in its entirety.

BACKGROUND OF THE INVENTION

1. Field of the Invention

The invention relates to a memory device having non-volatile memory elements and read-out circuits for reading out the items of memory information stored in the memory elements. The memory elements are implemented in particular as fuse memory elements. Furthermore, the invention relates to a method for operating a memory device of this type.

2. Description of the Related Art

So-called fuse memory elements are increasingly being used in integrated circuits. A fuse memory element essentially comprises a metal-metal connection or some other electrically conductive connection, such as polysilicon for example, having a low contact resistance. The metal-metal connection can be interrupted after the actual production process, whereby the contact resistance of the fuse memory element is increased. The fuse memory element can thus assume the programming states "conducting" and "non-conducting", that is to say it represents either a logic 0 or a logic 1.

Items of information which specify specific properties of a chip can be permanently stored on the chip by means of fuse memory elements. Said items of information relate for example to the identification number of the chip, individual trimming or adjustment settings of internal voltages or a chip-specific configuration. Furthermore, fuse memory elements are used for example for storing the items of memory information of defective memory elements.

The metal-metal connection of a fuse memory element is interrupted as required either by the application of a current or by the action of a laser beam. Fuse memory elements are referred to as electrical fuse memory elements or else laser fuse memory elements depending on the method by means of which their metal-metal connections can be interrupted.

Furthermore, so-called antifuse memory elements exist, in the case of which an electrical connection is not interrupted, rather such a connection is provided after the actual production process for programming purposes. No distinction is made hereinafter between fuse and antifuse memory elements. Instead, the term "fuse memory element" is understood to mean both types of fuse memory elements.

In the German-language technical literature, the terms "Schmelzbrücken" ["fusible links"], "auftrennbare Schmelzbrücken" ["interruptible fusible links"] or "Sicherungen" ["fuses"] are occasionally used for fuse memory elements. However, even in the German-language technical literature, the English term "fuse" is significantly more common. Therefore, the text hereinafter will refer to fuse memory elements.

For read-out and buffer-storage of their programming state, fuse memory elements are connected to circuits specifically designed for this purpose. A circuit of this type comprises a read-out circuit, which measures the fuse resistance and from this determines the memory information stored in the fuse memory element. In this case, generally a high fuse resistance of an interrupted fuse connection represents a logic 1, while a low resistance of an intact fuse connection represents a logic 0. The memory information determined in this way is buffer-stored in a volatile signal memory, for example a latch signal memory or a flip-flop.

It may happen that a semiconductor chip contains more than 1000 fuse memory elements. In such a case, the read-out circuits and signal memories intended for the fuse memory elements can make a significant contribution to the energy consumption of the chip. Particularly in systems designed for wireless applications, such as mobile radio systems for example, it is necessary to reduce the high standby consumption of the fuse circuits.

For this reason, switches which can isolate whole groups of fuse memory elements and the circuits connected thereto from the supply voltage are incorporated into conventional systems. Said switches are opened, that is to say that the fuse circuits connected to the switches are isolated from the supply voltage, as soon as a control unit establishes that the data stored in the relevant fuse memory elements are not required at this point in time.

SUMMARY OF THE INVENTION

Embodiments of the invention provide a memory device comprising non-volatile memory elements, in particular fuse memory elements, whose energy consumption is reduced further by comparison with conventional memory devices. Furthermore, an embodiment of the invention provides a method for operating a memory device of this type.

The memory device according to one embodiment of the invention comprises at least one non-volatile memory element, a read-out circuit for reading out an item of memory information stored in the memory element, a switching unit and a control unit. By means of the switching unit, the read-out circuit may optionally have applied to it a supply voltage required for its operation or be isolated from the supply voltage. The control unit serves for controlling the switching unit. The switching unit is controlled at least temporarily in a manner dependent on the memory information stored in the at least one memory element.

It is conceivable for the control of the switching unit not to depend on the programming state of the memory element during specific time segments. Therefore, the control according to the invention merely has the capability of controlling the switching unit in a manner dependent on the programming state of the memory element, that is to say that further operating modes of the control unit may also be provided.

One advantage of an embodiment of the memory device according to the invention resides in the fact that the decision as to whether the memory element and the read-out circuit assigned thereto are to be kept fully operationally available is made dependent on the programming state. If the memory element has not been programmed, for example, it is not required for the operation of the memory device under certain circumstances. Accordingly, the associated read-out circuit can be isolated from the supply voltage, whereby an energy saving is obtained as a result.

Since semiconductor chips often contain a multiplicity of non-volatile memory elements, such as fuse memory elements for example, and only a small portion thereof is generally used in order to alter the behaviour of the chip in a specific manner, it is advantageous to apply the supply voltage only to the memory elements and read-out circuits thereof which comprise items of chip-specific information. By way of example, data provided for trimming an internal voltage may be stored in the memory elements. However, the presetting of the internal voltage often already has a sufficient accuracy, so that no bits for voltage setting have to be stored in the memory elements. In this case, the read-out circuits associated with said memory elements can be isolated from the supply voltage.

The memory device according to the invention is particularly suitable for use in the baseband chip of a mobile radio apparatus.

The switching unit may preferably be controlled by the control unit in such a way that the read-out circuit is isolated from the supply voltage if a predetermined item of memory information is stored in the memory element. By way of example, the predetermined programming state may be the unprogrammed state or alternatively the programmed state of the memory element.

Furthermore, the memory device according to the invention advantageously comprises a volatile signal memory, which is connected downstream of the read-out circuit and in which the memory information read out from the memory element by the read-out circuit can be buffer-stored. The volatile signal memory may be realized for example as a latch signal memory or as a flip-flop.

The supply voltage likewise has to be applied to the volatile signal memory for the operation thereof. This can be done in two different ways. Either the switching unit is connected between the supply voltage and the volatile signal memory or the volatile signal memory is fixedly connected to the supply voltage. In the case of the first alternative, the supply voltage is applied to the volatile signal memory precisely when this also holds true for the read-out circuit. Consequently, if the memory information stored in the memory element is intended to be available, the volatile signal memory is also held in the operating state required for its function. If the memory information of the memory element is not required, the volatile signal memory is isolated from the supply voltage in the same way as the read-out circuit. This leads to an energy saving, but has the disadvantage that the potential at the output of the volatile signal memory is not precisely defined, which, under certain circumstances, leads to problems for the components connected downstream of the output. This problem is solved by the second alternative mentioned above, in which the volatile signal memory is always connected to the supply voltage and a defined potential is thus always present at its output. A further possibility for suppressing fluctuating potentials in the case of a switched-off volatile signal memory consists in an isolation gate being connected downstream of the volatile signal memory on the output side.

In order that the control unit can take account of the programming state of the memory element in the control of the switching unit, the output of the read-out circuit or the output of the volatile signal memory is preferably connected to a control input of the control unit.

Various possibilities are available for interconnecting the switching unit with the read-out circuit and, if appropriate, the volatile signal memory. The switching unit applies to the read-out circuit, and, if appropriate, the volatile signal memory, either only the positive potential or the negative potential of the supply voltage. The respective other potential of the supply voltage is then fixedly connected to the read-out circuit and, if appropriate, the volatile signal memory. As an alternative, it is also possible for both potentials of the supply voltage to be switched by the switching unit.

If the switching unit is connected between the positive potential of the supply voltage and the read-out circuit, the switching unit is preferably realized as a p-channel FET. In the case where the switching unit is arranged between the negative potential of the supply voltage and the read-out circuit, the switching unit is advantageously implemented as an n-channel FET.

In accordance with one preferred refinement of the invention, the memory device comprises not just one memory element, but a plurality of memory elements of identical type. Each of the memory elements is assigned a read-out circuit for reading out the memory information stored in the relevant memory element. The read-out circuits and, if appropriate, the volatile signal memories connected downstream of the read-out circuits may be configured in the same way as has been described above by way of example for a single memory element with a single read-out circuit and a single volatile signal memory.

A further refinement of the invention provides for a single switching unit to connect the read-out circuits to the supply voltage, so that at any point in time either all of the read-out circuits and, if appropriate, all of the volatile signal memories have the supply voltage applied to them or are isolated from the supply voltage.

In the decision as to whether or not the read-out circuits and, if appropriate, the volatile signal memories are to be connected to the supply voltage, it is not absolutely necessary for the programming states of all of the memory elements to be taken into account. Preferably, it is also possible for only the programming states of a specific group of memory elements or even only the programming state of a single memory element to be used for said decision.

As an alternative to a single switching unit and a single control unit, a dedicated switching unit and also a dedicated control unit may be assigned to each of the read-out circuits. In this case, in the decision as to whether or not a read-out circuit and, if appropriate, the assigned volatile signal memory are intended to be isolated from the supply voltage, only the programming state of the memory element assigned to the read-out circuit is taken into account, and not the programming state of other memory elements.

The advantage of this measure consists, on the one hand, in the fact that a decision can be taken for each memory element individually as to whether the respective memory element is subsequently required. On the other hand, the memory device becomes easier to implement since—as will be explained further below in connection with the memory device shown in FIG. 5—the external wirings of a chip having a plurality of memory cells each containing a memory element, a read-out circuit, a switching unit and a control unit are less complicated.

In accordance with a further preferred refinement of the invention, the non-volatile memory elements are realized as fuse memory elements. The predetermined programming state of the fuse memory elements may be either the unprogrammed state, that is to say the state preset during the production of the respective fuse memory element, or the programmed state.

The previous description of the invention should be supplemented by stating that the memory device may have not only the memory elements whose read-out circuits are supplied with the supply voltage in accordance with the invention, but also memory elements whose read-out circuits are connected to conventional switching units, that is to say in which the programming state of the memory elements is unimportant in the control of the switching unit.

Preferably, the switching unit applies the supply voltage not only to the read-out circuits and, if appropriate, the volatile signal memories, but also to at least one further unit of the memory device. Consequently, said unit has the supply voltage applied to it or is isolated from the supply voltage during the same time segments as the read-out circuit. This refinement of the invention permits a further energy saving to be obtained.

The above-described principle according to which a further unit is connected to the supply voltage via the switching unit may advantageously be applied to a replacement memory unit. The replacement memory unit serves for replacing defective memory cells of a memory unit, that is to say that items of memory information which are actually intended to be stored in the memory unit are stored in the replacement memory unit since the relevant memory cells are defective. If the defective memory cells of the memory unit are accessed, the corresponding memory entry is read out from the replacement memory unit. In order to establish whether and which memory cells of the memory unit are defective, test algorithms are run through prior to the operation of the memory unit. A typical replacement memory unit and the operation thereof are described in greater detail in the U.S. Pat. No. 6,536,003 B1.

The information about whether or not memory cells of the memory unit are intended to be replaced is preferably stored in the memory element. If the memory element is unprogrammed, this means, for example, that no memory cells of the memory unit are replaced by the replacement memory unit. In this case, not only the read-out circuit of the memory element but in addition also the replacement memory unit is isolated from the supply voltage. Since the memory units arranged on a semiconductor chip generally have no defects, this measure leads to a considerable energy saving.

For suitably reading out the memory entries from the memory unit and the replacement memory unit, a multiplexer may be connected downstream of the two units. If the replacement memory unit is not required and it is isolated from the supply voltage, the output of the multiplexer is advantageously connected to the input of the multiplexer which is connected to the data output of the memory unit. This measure ensures that data can be output from the memory unit during every access.

The method according to one embodiment of the invention serves for operating a memory device having at least one non-volatile memory element and a read-out circuit for reading out an item of memory information stored in the at least one memory element. The method according to one embodiment of the invention has the following method steps:

(a) read-out of the memory information stored in the at least one memory element;

(b) isolation of the read-out circuit from a supply voltage or application of a supply voltage to the read-out circuit in a manner dependent on the memory information stored in the at least one memory element.

The method according to one embodiment of the invention has the same advantages over conventional methods used for the same purpose as the memory device according to the invention.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
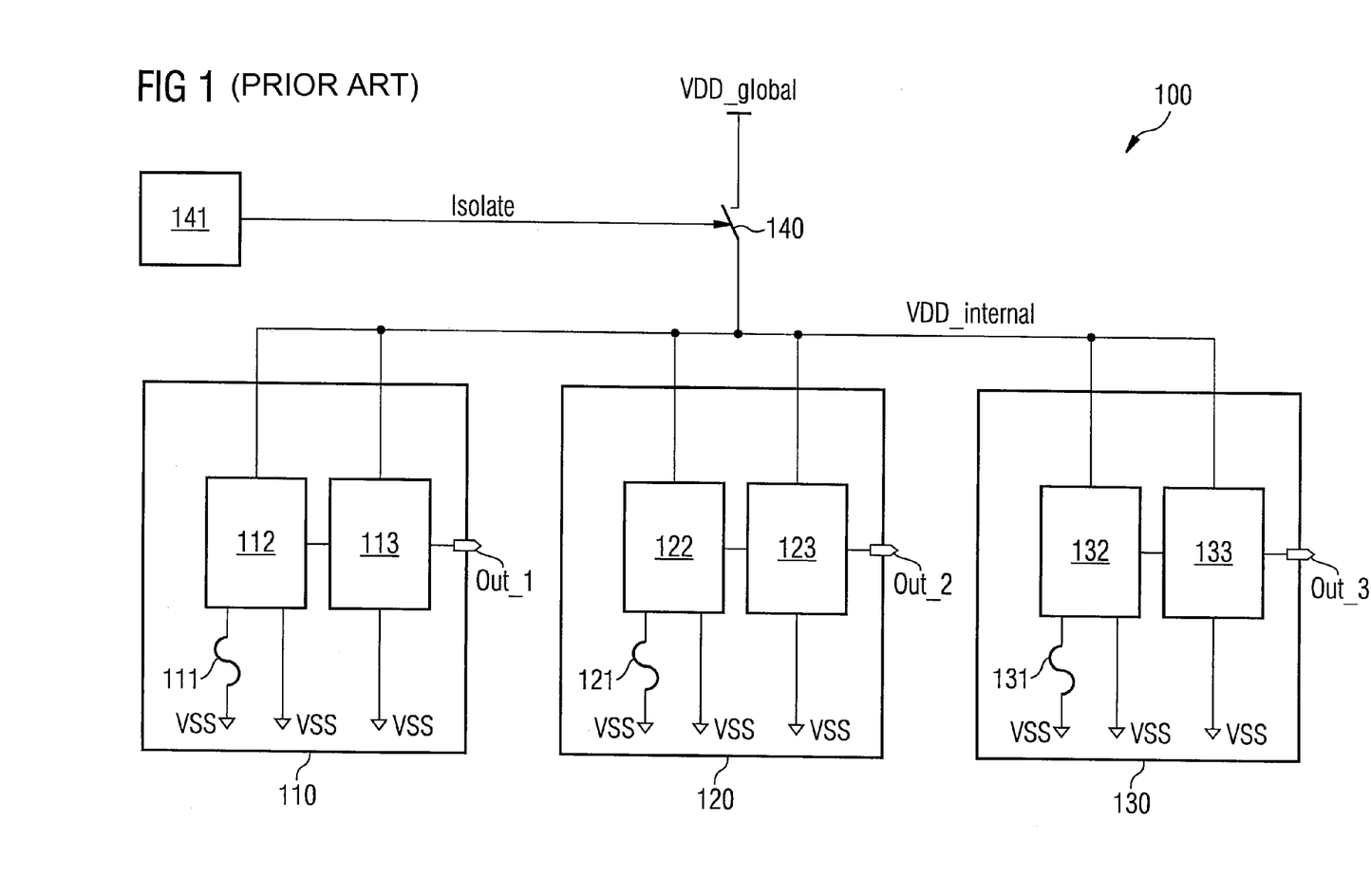
FIG. 1 shows a block diagram of a memory device 100 in accordance with the prior art.

FIG. 1 illustrates the block diagram of a conventional memory device 100. The memory device 100 contains three fuse memory cells 110, 120 and 130. Each of the fuse memory cells 110, 120 and 130 has a fuse memory element 111, 121 and 131, respectively, for storing a bit. An earth potential VSS is applied to the fuse memory elements 111, 121 and 131 at one terminal thereof. The other terminals of the fuse memory elements 111, 121 and 131 are in each case connected to the read terminal of a read-out circuit 112, 122 and 132, respectively, for the reading-out of the respective programming state. A volatile signal memory 113, 123 and 133 is respectively connected downstream of the read-out circuits 112, 122 and 132, respectively, and serves for buffer-storing the bit read out from the fuse memory elements 111, 121 and 131, respectively. The outputs of the volatile signal memories 113, 123 and 133 simultaneously represent the outputs Out_1, Out_2 and Out_3 of the fuse memory cells 110, 120 and 130 at which the programming state of the respective fuse memory element 111, 121 and 131 is output.

Further details on the construction of fuse memory cells may be found in the U.S. Pat. No. 6,536,003 B1.

Both the read-out circuits 112, 122 and 132 and the volatile signal memories 113, 123 and 133 have a terminal for application of the positive potential VDD_global of a supply voltage. These terminals can be connected to the supply voltage potential VDD_global via supply voltage lines VDD_internal and also a switch 140. The switch 140 is controlled by a control unit 141 by means of a control signal Isolate.

The control unit 141 decides when the fuse memory cells 110, 120 and 130 are isolated from the supply voltage potential VDD. As soon as the connection between the supply voltage lines VDD_internal and the supply voltage potential VDD_global is intended to be interrupted, the control unit 141 generates a corresponding control signal Isolate by means of which the switch 140 is opened. The current consumption of the fuse memory cells 110, 120 and 130 is thereby prevented.

Figure 2:
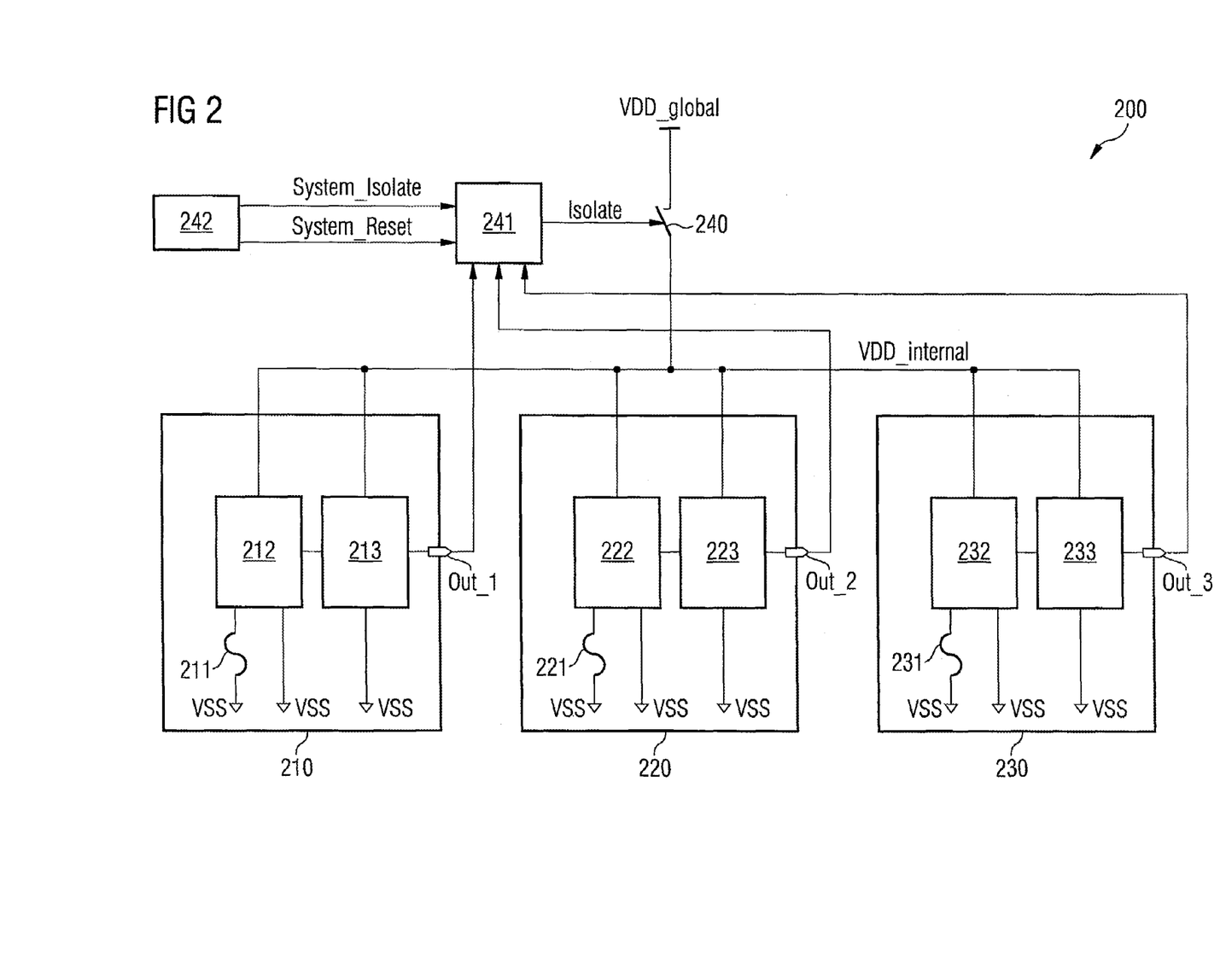
FIG. 2 shows a block diagram of a memory device 200 as a first exemplary embodiment of the memory device according to the invention.

FIG. 2 illustrates the block diagram of a memory device 200 serving as a first exemplary embodiment of the memory device according to the invention. The memory device 200 has three fuse memory cells 210, 220 and 230 constructed in exactly the same way as the fuse memory cells 110, 120 and 130 of the memory device 100 shown in FIG. 1. Accordingly, the fuse memory cells 210, 220 and 230 contain as components fuse memory elements 211, 221 and 231, read-out circuits 212, 222 and 232 and also volatile signal memories 213, 223 and 233. The volatile signal memories 213, 223 and 233 may be realized for example as latch signal memories or as flip-flops.

Furthermore, the memory device 200 corresponds to the memory device 100 in terms of the switch 240, by means of which the supply voltage lines VDD_internal leading to the fuse memory cells 210, 220 and 230 can optionally be connected to the supply voltage potential VDD_global or be isolated from the latter. The switch 240 is generally realized as a large p-channel FET.

The memory device 200 serving as an exemplary embodiment of the invention differs from the conventional memory device 100 in terms of the driving of the switch 240. The switch 240 is driven by a control unit 241 by means of a control signal Isolate, upon the generation of which the programming state of the fuse memory elements 211, 221 and 231 is taken into account at specific points in time. For this purpose, three control inputs of the control unit 241 are connected to in each case one of the outputs Out_1, Out_2 and Out_3 of the fuse memory cells 210, 220 and 230. The two further control inputs of the control unit 241 are fed by control signals System_Isolate and System_Reset, respectively, which are generated by a superordinate system control unit 242. The functioning of the control of the switch 240 is illustrated below with reference to the diagrams shown in FIGS. 3 and 4.

Figure 3:
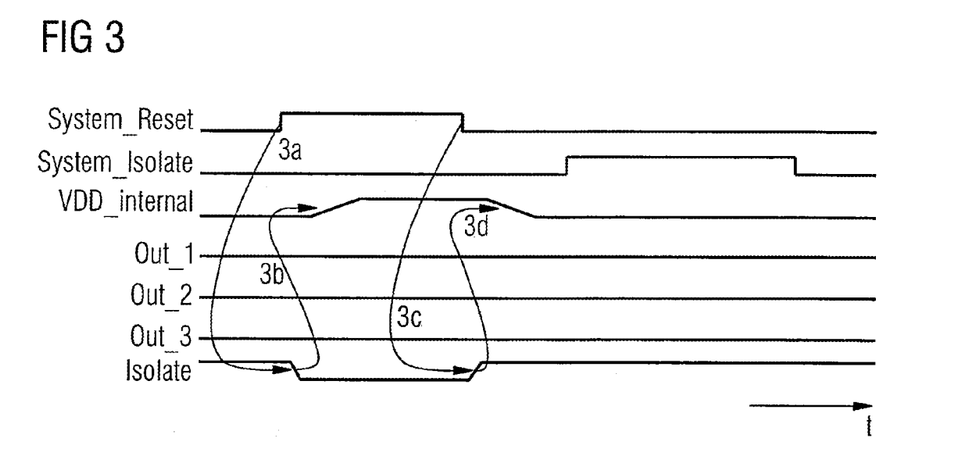
FIG. 3 shows diagrams for illustrating the functioning of the memory device 200 illustrated in FIG. 2.

In FIG. 3, various control signals and potentials which are transmitted or occur during the operation of the memory device 200 are plotted against the time t. Specifically, the control signals System_Reset, System_Isolate and Isolate and also the potentials present at the outputs Out_1, Out_2 and Out_3 and on the supply voltage lines VDD_internal are illustrated in the diagrams of FIG. 3. Each signal and each potential can assume two states. The state present at the respective instant t is identified by a solid line, while the other possible state is represented by an interrupted line.

FIG. 3 illustrates the case where none of the fuse memory elements 211, 221 and 231 has been programmed. Consequently, all three fuse memory elements 211, 221 and 231 have an intact fuse connection. When the memory system including the memory device 200 is started up or activated, the system control unit 242 communicates the control signal System_Reset to the control unit 241. The control signal System_Reset causes a deactivation of the control signal Isolate, as a result of which the previously open switch 240 is closed. This is illustrated by an arrow 3a in FIG. 3. Accordingly, the potential of the supply voltage lines VDD_internal rises from the earth potential VSS previously present to the positive supply voltage potential VDD_global (cf. arrow 3b). The supply voltage necessary for reading out the programming state of the fuse memory elements 211, 221 and 231 is now present at the fuse memory cells 210, 220 and 230 and the respective items of memory information are correspondingly indicated at the outputs Out_1, Out_2 and Out_3. Since none of the three fuse memory elements 211, 221 and 231 has been programmed and they therefore have a low fuse resistance, the output signals of the fuse memory cells 210, 220 and 230 remain in the low state. This is the preset state which the fuse memory cells 210, 220 and 230 already had during their production and which states that no chip-specific information has been stored in the fuse memory cells 210, 220 and 230. The control unit 241 can establish this since the output signals of the fuse memory cells 210, 220 and 230 are fed to it, and therefore recognizes that the fuse memory cells 210, 220 and 230 are not required during the further operation of the memory system. Consequently, the total energy consumption of the system can be reduced by isolating the fuse memory cells 210, 220 and 230 from the supply voltage. This is done at the end of the pulse of the control signal System_Reset. As soon as the control signal System_Reset is reset, the control unit 241 activates the control signal Isolate (cf. arrow 3c). The resultant opening of the switch 240 has the consequence that the potential of the supply voltage lines VDD_internal falls to the earth potential (cf. arrow 3d) and the fuse memory cells 210, 220 and 230 are switched off.

A further possibility for controlling the switch 240 is provided by the control signal System_Isolate. By means of the control signal System_Isolate, the system control unit 242 can determine that the fuse memory cells 210, 220 and 230 are deactivated, to be precise independently of the items of memory information stored in the fuse memory cells 210, 220 and 230. An activation of the control signal System_Isolate is likewise illustrated in FIG. 3. Since the fuse memory cells 210, 220 and 230 have already been isolated from the supply voltage at this point in time, the activation of the control signal System_Isolate does not have any effects in this case.

Figure 4:
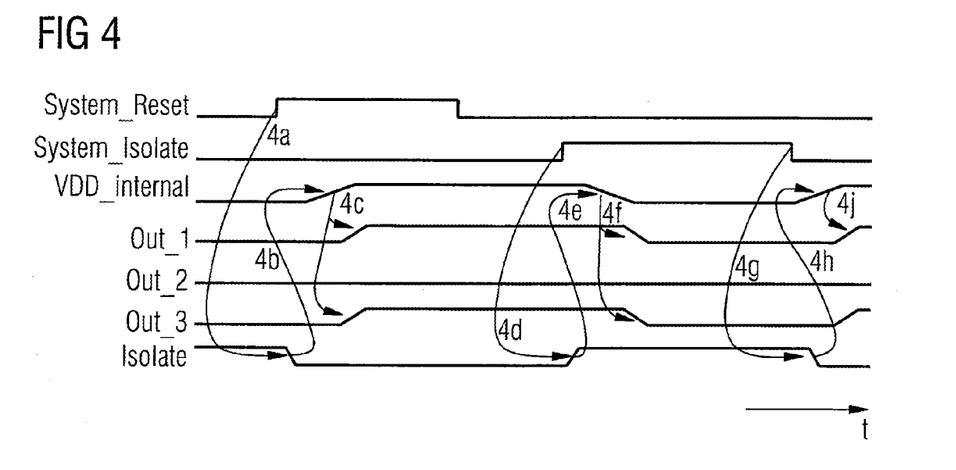
FIG. 4 shows further diagrams for illustrating the functioning of the memory device 200 illustrated in FIG. 2.

FIG. 4 illustrates the operation of the memory device 200 in the case of a different programming state of the fuse memory elements 211, 221 and 231. In this exemplary embodiment, the fuse memory elements 211 and 231 have been programmed, that is to say that their fuse connections have been interrupted, while the fuse connection of the fuse memory element 221 is still in its original intact state.

In the same way as in FIG. 3, the control signals System_Reset, System_Isolate and Isolate and also the potentials present at the outputs Out_1, Out_2 and Out_3 and on the supply voltage lines VDD_internal are plotted against the time t in FIG. 4. In the event of system activation, the control signal System_Reset is activated, which deactivates the control signal Isolate (cf. arrow 4a) and thereby has the effect that the supply voltage lines VDD_internal assume the positive supply voltage potential VDD_global (cf. arrow 4b). As soon as the supply voltage is present at the fuse memory cells 210, 220 and 230, the potentials that can be tapped off at the outputs Out_1 and Out_3 change to the higher state (cf. arrows 4c) on account of the programming state present, while the potential at the output Out_2 remains in the low state. The control unit 241 measures the output voltages of the fuse memory cells 210, 220 and 230 and correspondingly establishes that not all of the fuse memory cells 210, 220 and 230 are in the unprogrammed state and the fuse memory cells 210, 220 and 230 therefore contain items of memory information which are required for the operation of the system. Accordingly, at the end of the pulse of the control signal System_Reset, the control signal Isolate is not activated by the control unit 241, with the result that the switch 240 still remains closed and the fuse memory cells 210, 220 and 230 remain activated.

It is only if the system control unit 242 intends to switch off the fuse memory cells 210, 220 and 230 that the control signal System_Reset is activated and the control signal Isolate is switched to the high state by the control unit 241 (cf. arrow 4d). This brings about an opening of the switch 240 and a drop in the potential of the supply voltage lines VDD_internal to the earth potential VSS (cf. arrow 4e). As a result, the fuse memory cells 210, 220 and 230 are isolated from the supply voltage (cf. arrows 4f).

If the memory contents of the fuse memory cells 210, 220 and 230 are required again at a later point in time, the control signal System_Isolate is deactivated, which has the consequence that the control signal Isolate is likewise deactivated (cf. arrow 4g) and the positive supply voltage potential VDD_global is applied to the fuse memory cells 210, 220 and 230 (cf. arrow 4h). The output potentials of the fuse memory cells 210 and 230 thereupon rise on account of their programming state (cf. arrow 4j).

Although the description of the functioning of the memory device 200 has up to now assumed that the fuse memory cells 210, 220 and 230, in the event of a system start, are isolated from the positive supply voltage potential VDD_global whenever all the fuse memory elements 211, 221 and 231 have their programming state preset during production, that is to say whenever their fuse connections are intact, the control of the switch 240 in the event of a system start may also be based on other stipulations. By way of example, the control unit 241 may also be set in such a way that it isolates the fuse memory cells 210, 220 and 230 from the supply voltage only when one or a plurality of the fuse connections of the fuse memory elements 211, 221 and 231 have been interrupted.

Furthermore, the memory device 200 may comprise more than the fuse memory cells 210, 220 and 230 illustrated in FIG. 2, and only a specific number of said fuse memory cells or even only a single fuse memory cell is taken into consideration in the decision as to whether or not all of the fuse memory cells or a group of the fuse memory cells are intended to be isolated from the supply voltage.

A further variation of the memory device 200 may consist in the switch 240 being designed to connect the fuse memory cells 210, 220 and 230 to the earth potential VSS. In this case, the switch 240 could be realized as a large n-channel FET, by way of example.

So-called isolation gates may be provided as a further configuration of the memory device 200. Said isolation gates serve for generating constant output potentials at the outputs Out_1, Out_2 and Out_3 in the case where the fuse memory cells 210, 220 and 230 have been isolated from the supply voltage. This prevents fluctuating output potentials which, under certain circumstances, might impair the operation of the components connected downstream of the outputs Out_1, Out_2 and Out_3. As an alternative to the isolation gates, the volatile signal memories 213, 223 and 233 may also have the supply voltage applied to them in constant fashion. Fluctuating output potentials are likewise prevented as a result.

Figure 5:
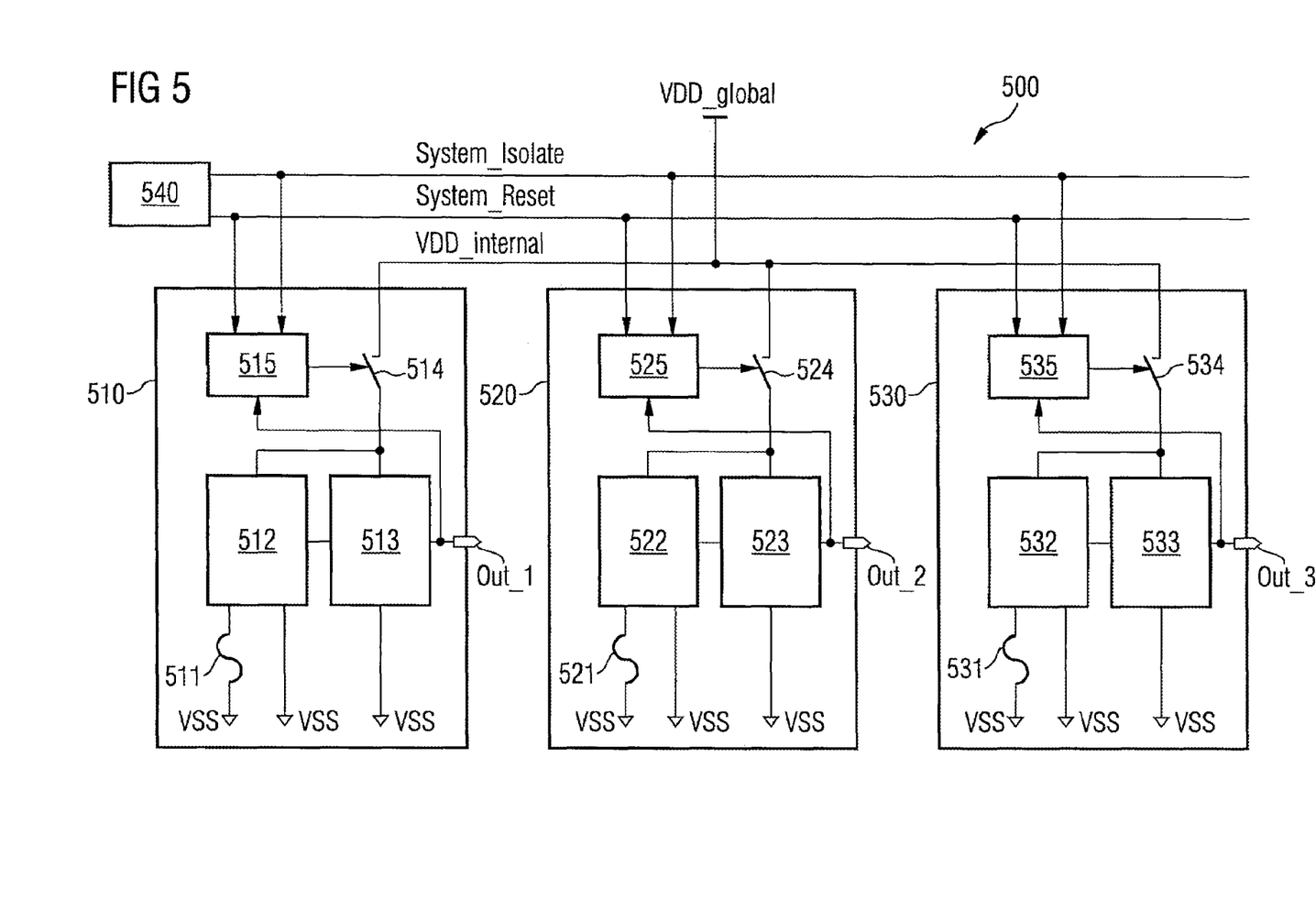
FIG. 5 shows a block diagram of a memory device 500 as a second exemplary embodiment of the memory device according to the invention.

FIG. 5 shows the block diagram of a memory device 500 serving as a second exemplary embodiment of the memory device according to the invention. The memory device 500 has three fuse memory cells 510, 520 and 530 containing as components, in exactly the same way as the fuse memory cells 210, 220 and 230 of the memory device 200, fuse memory cells 511, 521 and 531, read-out circuits 512, 522 and 532 and also volatile signal memories 513, 523 and 533. In contrast to the memory device 200, in the case of the memory device 500, switches 514, 524 and 534 by means of which the components of the fuse memory cells 510, 520 and 530 can be connected to the positive supply voltage potential VDD_global are arranged in the fuse memory cells 510, 520 and 530. Furthermore, control units 515, 525 and 535 for controlling the switches 514, 524 and 534 are integrated into the fuse memory cells 510, 520 and 530.

The memory device 500 furthermore comprises a system control unit 540, which corresponds to the system control unit 242 of the memory device 200 in terms of its function and which controls the control units 515, 525 and 535 by means of the control signals System_Isolate and System_Reset. Furthermore, the control units 515, 525 and 535 in each case have a further control input connected to the output Out_1, Out_2 and Out_3 of the respective fuse memory cell 510, 520 and 530.

The functioning of the memory device 500 essentially corresponds to that of the memory device 200 with the difference that the control units 515, 525 and 535 for controlling the switches 514, 524 and 534, in the event of the system start, only take into account the programming state of the fuse memory element 511, 521 or 531 assigned to them. If the programming state corresponds to the respectively preset or predetermined programming state, the respective fuse memory cell 510, 520 or 530 is isolated from the positive supply voltage potential VDD_global.

The configuration possibilities described further above with regard to the memory device 200 correspondingly hold true for the memory device 500.

The memory device 500 has the advantage over the memory device 200 illustrated in FIG. 2 of simpler implementation. This is because, in the case of the memory device 500, the fuse memory cells 510, 520 and 530 can be directly connected to the positive supply voltage potential VDD_global. By contrast, the realization of the memory device 200 requires fewer components and less chip area than in the case of the memory device 500.

Figure 6:
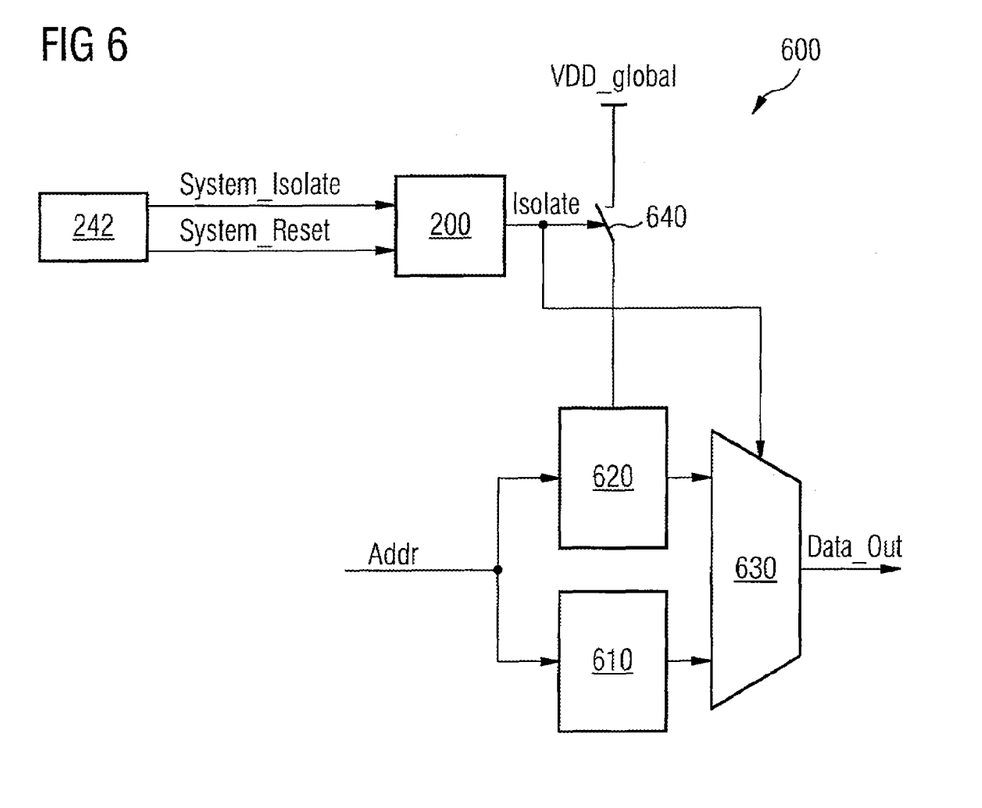
FIG. 6 shows a block diagram of a memory system 600 as a third exemplary embodiment of the memory device according to the invention.

FIG. 6 illustrates the block diagram of a memory system 600 serving as a third exemplary embodiment of the memory device according to the invention. The memory system 600 comprises the memory device 200 illustrated in FIG. 2. For improved illustration of the functioning of the memory system 600, FIG. 6 illustrates the system control unit 242 outside the memory device 200. Furthermore, the control signal Isolate is used not only for controlling the structure contained in the memory device 200, but also for controlling a multiplexer 630 and a switch 640.

The memory system 600 furthermore contains a memory unit 610 and a replacement memory unit 620. The replacement memory unit 620, to which the supply voltage can be applied by means of the switch 640, serves for replacing defective memory cells of the memory unit 610, that is to say that the data which are intended for the defective memory cells are stored in the replacement memory unit 620. If the memory unit 610 is accessed by means of an address signal Addr and the requested data are stored in the replacement memory unit 620, said data are output by the replacement memory unit 620. In this case, the multiplexer 630 is switched in such a way that the data output by the replacement memory unit 620 are output at the output Data_Out.

Items of information regarding whether the replacement memory unit 620 is actually required are stored in the fuse memory elements 211, 221 and 231 of the memory device 200. If, as has already been explained further above, the fuse memory elements 211, 221 and 231 are unprogrammed, this means that the memory unit 610 has no defective memory cells and correspondingly no data have been stored in the replacement memory unit 620. Since, moreover, the replacement memory unit 620 is connected to the positive supply voltage potential VDD_global via the switch 640, it is the case that upon the activation of the control signal Isolate, besides the switch 240 arranged in the memory device 200, the switch 640 of the memory system 600 is also opened and the replacement memory unit 620 is thus isolated from the supply voltage, with the result that a further energy saving is obtained.

Furthermore, the control signal Isolate feeds a control input of the multiplexer 630. This ensures that in the case of a replacement memory unit 620 isolated from the supply voltage, the output of the memory unit 610 is always connected to the output Data_Out of the memory system 600.

As an alternative to the embodiment of the memory system 600 as shown in FIG. 6, it is conceivable, within a memory system 600, for the supply voltage (VDD_global) to be applied both to the memory device 200 and to the replacement memory unit 620 by a common switching unit (640 or 240).

The configuration of the invention as illustrated in FIG. 6 is suitable in particular for replacement memory units of so-called SRAMs (Static Random Access Memory) (see U.S. Pat. No. 6,536,003 B1). In practice it is only rarely the case here that a replacement memory unit is required for the repair of the SRAM, so that the further energy saving mentioned can advantageously be applied in many cases.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   at least one non-volatile memory element;
   a read-out circuit for reading out an item of memory information stored in the at least one memory element;
   a switching unit operable to apply a supply voltage to the read-out circuit; and
   a control unit, configured to control the switching unit in a manner dependent on the memory information stored in the at least one memory element, wherein the switching unit switches the read-out circuit off dependent on the memory information stored in the at least one memory element.

2. The memory device according to claim 1, further comprising a volatile signal memory for buffer-storing the memory information read out from the at least one memory element by the read-out circuit.

3. The memory device according to claim 2, wherein the switching unit is connected to the volatile signal memory, in such a way that when the supply voltage is applied to the read-out circuit, the supply voltage is likewise applied to the volatile signal memory and when the read-out circuit is isolated from the supply voltage, the volatile signal memory is likewise isolated from the supply voltage.

4. The memory device according to claim 2, wherein application of the supply voltage to the volatile signal memory is independent of the application of the supply voltage to the read-out circuit.

5. The memory device according claim 2, wherein the output of the volatile signal memory at which the memory information stored in the at least one memory element can be read, is connected to a control input of the control unit.

6. The memory device according to claim 1, wherein the switching unit is connected between the read-out circuit and one of:
   (i) a positive potential of the supply voltage,
   (ii) a negative potential of the supply voltage and
   (iii) both the negative and positive potentials of the supply voltage.

7. The memory device according to claim 1, wherein the memory device comprises a plurality of non-volatile memory elements, and wherein each of the non-volatile memory elements is assigned a respective read-out circuit for reading out the memory information stored in the respective memory element.

8. The memory device according to claim 7, wherein the switching unit simultaneously applies the supply voltage to all of the read-out circuits or isolates the read-out circuits from the supply voltage.

9. The memory device according to claim 7, wherein the control unit, during the control of the switching unit, takes into account only one of (i) the items of memory information stored in a portion of the memory elements and (ii) the memory information stored in one memory element.

10. The memory device according to claim 7, wherein:
    each of the read-out circuits is assigned a respective switching unit for applying the supply voltage to the respective read-out circuit; and
    each of the switching units is assigned a respective control unit configured to control the assigned switching unit in a manner dependent on the memory information stored in the assigned memory element.

11. The memory device according to claim 1, wherein the at least one non-volatile memory element is a fuse memory element.

12. The memory device according to claim 1, further comprising at least one additional unit and wherein the switching unit is operable to apply the supply voltage to the at least one additional unit.

13. The memory device according to claim 1, further comprising a memory unit and a replacement memory unit for replacing defective memory cells of the memory unit, and wherein the switching unit is operable to apply the supply voltage either to the replacement memory unit or to the memory unit.

14. The memory device according to claim 13, wherein the control unit is configure to has isolate the replacement memory unit from the supply voltage when no memory cells of the memory unit are replaced by the replacement memory unit.

15. The memory device according to claim 13, further comprising a multiplexer, a first input of which is connected to a data output of the memory unit and a second input of which is connected to a data output of the replacement memory unit, and wherein the control unit, in the event of isolation of the replacement memory unit from the supply voltage, controls the multiplexer in such a way that the first input of the multiplexer is switched through to the output of the multiplexer.

16. A method for operating a memory device having at least one non-volatile memory element, a control circuit, a switching circuit and a read-out circuit for reading out an item of memory information stored in the at least one memory element, the method comprising:
    (a) reading out of the memory information stored in the at least one memory element; and
    (b) dependent on the memory information stored in the at least one memory element, controlling the switching circuit with the control circuit to one of:
       switch off the read-out circuit from a supply voltage when a predetermined item of the memory information is stored in the at least one memory element; and
       apply the supply voltage to the read-out circuit.

17. The method according to claim 16, further comprising buffer-storing the memory information read out from the at least one memory element by the read-out circuit in a volatile signal memory of the memory device.

18. The method according to claim 17, wherein when the supply voltage is applied to the read-out circuit, the supply voltage is likewise applied to the volatile signal memory and when the read-out circuit is isolated from the supply voltage, the volatile signal memory is likewise isolated from the supply voltage.

19. The method according to claim 17, wherein application of the supply voltage to the volatile signal memory is independent of the application of the supply voltage to the read-out circuit.

20. The method according to claim 16, wherein the memory device has a plurality of non-volatile memory elements, and wherein each of the non-volatile memory elements is assigned a read-out circuit for reading out the memory information stored in the respective memory element.

21. The method according to claim 20, further comprising at least one of:
   (i) simultaneously supplying the supply voltage to all of the read-out circuits, and
   (ii) isolating the supply voltage from all of the read-out circuits.

22. The method according to claim 20, further comprising:
   isolating the supply voltage from all of the read-out circuits depending only on the items of memory information stored in a portion of the memory elements.

23. The method according to claim 20, further comprising:
   isolating the supply voltage from all of the read-out circuits depending only on the memory information stored in one memory element.

24. The method according to claim 20, further comprising, for each memory element:
   determining whether to isolate the supply voltage from the respective read-out circuit or apply the supply voltage to the respective read-out circuit is dependent on the memory information stored in the respective memory element.

25. The method according claim 16, wherein the at least one non-volatile memory element is a fuse memory element.

26. A memory device comprising:
   a plurality of non-volatile memory elements;
   a plurality of read-out circuits for reading out an item of memory information stored in the plurality of memory elements;
   a switching unit operable to apply a supply voltage to the plurality of read-out circuits; and
   a control unit configured to control the switching unit in a manner dependent on the memory information stored in each one of the plurality of memory elements.

27. A method for operating a memory device having a plurality of non-volatile memory elements, a control circuit, a switching circuit and a plurality of read-out circuits for reading out an item of memory information stored in a plurality of memory elements, the method comprising:
   (a) reading out of the memory information stored in each one of the plurality of memory elements; and
   (b) dependent on the memory information stored in each one of the plurality of memory elements, controlling the switching circuit with the control circuit to one of:
   switch off the read-out circuits from a supply voltage; and
   apply the supply voltage to the read-out circuits.

* * * * *